US008020289B2

United States Patent
Sugimoto et al.

(10) Patent No.: US 8,020,289 B2
(45) Date of Patent: Sep. 20, 2011

(54) METHOD OF PRODUCING ELECTRONIC DEVICE

(75) Inventors: Keiichi Sugimoto, Kariya (JP); Mitsuru Nakagawa, Chiryu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 12/661,497

(22) Filed: Mar. 18, 2010

(65) Prior Publication Data
US 2010/0242273 A1  Sep. 30, 2010

(30) Foreign Application Priority Data
Mar. 25, 2009 (JP) ................. 2009-075026

(51) Int. Cl.
*H05K 3/30* (2006.01)
(52) U.S. Cl. ................ 29/841; 29/832; 29/833; 29/840; 29/852
(58) Field of Classification Search .............. 29/830, 29/832, 833, 840, 841, 852
See application file for complete search history.

(56) References Cited

U.S. PATENT DOCUMENTS

| 5,107,325 | A | * | 4/1992 | Nakayoshi | 257/793 |
| 5,677,568 | A | * | 10/1997 | Ochi et al. | 257/679 |
| 7,217,153 | B2 | * | 5/2007 | Sugimoto et al. | 439/500 |
| 2006/0250756 | A1 | | 11/2006 | Sugimoto et al. | |
| 2006/0252384 | A1 | | 11/2006 | Sugimoto et al. | |
| 2010/0246146 | A1 | * | 9/2010 | Sugimoto et al. | 361/757 |

FOREIGN PATENT DOCUMENTS
JP  8-181414  7/1996
JP  8-276458  10/1996

OTHER PUBLICATIONS
U.S. Appl. No. 12/661,494, filed Mar. 18, 2010, Sugimoto et al.
* cited by examiner

*Primary Examiner* — Carl Arbes
(74) *Attorney, Agent, or Firm* — Harness, Dickey & Pierce, PLC

(57) ABSTRACT

A method of producing an electronic device includes a molding of a first casing to seal a first face of a circuit board and electronic parts mounted on the first face. The producing method further includes a mounting of electronic parts on a second face of the circuit board opposite from the first face, after the molding of the first casing is finished. The producing method further includes a molding of a second casing to seal the second face of the circuit board and the electronic parts mounted on the second face. The molding of the second casing integrates the first casing and the second casing with each other.

8 Claims, 3 Drawing Sheets

METHOD OF PRODUCING ELECTRONIC DEVICE

CROSS REFERENCE TO RELATED APPLICATION

This application is based on Japanese Patent Application No. 2009-75026 filed on Mar. 25, 2009, the disclosure of which is incorporated herein by reference in its entirety.

BACKGROUND OF THE INVENTION

1. Field of the Invention

The present invention relates to a method of producing an electronic device.

2. Description of Related Art

An electronic device includes a circuit board having electronic parts, and a casing. The casing seals the circuit board except for a connecting terminal to be connected to outside, and is formed by molding thermosetting resin. Specifically, the circuit board is arranged in a cavity of a mold in a float state by using a supporting pin, and the thermosetting resin is filled in the cavity so as to be solidified.

The circuit board has a top face and a back face, and a circuit pattern is typically different between the top face and the back face. For example, positions for mounting the electronic parts are different between the top face and the back face. Therefore, a thickness pattern of the resin molded on the top face may be different from a thickness pattern of the resin molded on the back face, while the resins oppose to each other through the circuit board.

In this case, a hardening speed of the resin may be different between the top face and the back face, due to the difference of the thickness pattern. The difference in the hardening speed of the resin may cause a deformation of the circuit board, because a pressure generated from the resin is different between the top face and the back face. Further, connection reliability of the electronic parts may be lowered, or the electronic parts may have a malfunction, due to the pressure difference.

Further, the supporting pin makes a construction of the mold complicated. Furthermore, the molded casing has a trace of the supporting pin, such that appearance of the electronic device may become worse.

JP-A-2006-303327 discloses a method of producing an electronic device. Electronic parts are mounted on only a first face of a circuit board, and the circuit board is arranged in a cavity of a mold in a manner that a second face of the circuit board opposite from the first face is tightly contact with an inner wall face of the mold. Thermosetting resin is filled in the cavity, and the filled resin is hardened. Thus, a casing of the electronic device is molded by the hardened resin, and the second face of the circuit board defines a part of an outer surface of the electronic device.

In this case, while the casing is molded, only the first face of the circuit board is pressed by the thermosetting resin. Therefore, the circuit board can be restricted from having a deformation, and connection reliability of the electronic parts can be maintained. Further, because the supporting pin is unnecessary, the construction of the mold can be simplified, and the appearance of the electronic device can be made better.

However, a size of the circuit board becomes large, when the electronic parts are mounted on only the single face of the circuit board. In this case, a size of the electronic device also become large.

SUMMARY OF THE INVENTION

In view of the foregoing and other problems, it is an object of the present invention to provide a method of producing an electronic device.

According to an example of the present invention, a method of producing an electronic device includes a mounting of electronic parts on a first face of a circuit board. A holding of the circuit board is performed in a first cavity of a first mold in a manner that a second face of the circuit board opposite from the first face is tightly contact with an inner face of the first cavity of the first mold. A molding of a first casing is performed with thermosetting resin in a manner that the second face of the circuit board defines a part of an outer surface of the first casing. The first casing seals the first face of the circuit board and the electronic parts mounted on the first face. A mounting of electronic parts is performed on the second face of the circuit board, after the molding of the first casing is finished. A holding of the circuit board is performed in a second cavity of a second mold in a manner that a part of the outer surface of the first casing is tightly contact with an inner face of the second cavity of the second mold. A molding of a second casing is performed with thermosetting resin. The second casing seals the second face of the circuit board and the electronic parts mounted on the second face. The molding of the second casing integrates the first casing and the second casing with each other, such that the first casing and the second casing are tightly contact with each other.

Accordingly, the electronic device can be accurately produced.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENT

An electronic device is an electronic key system used for a vehicle, for example. Specifically, the electronic device is an electronic key corresponding to a mobile two-way transmitter used for a smart entry system.

Figure 1:
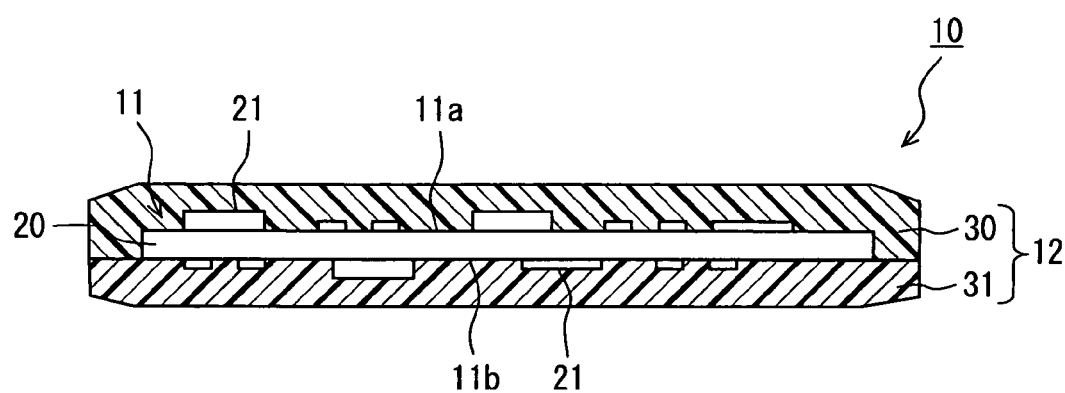
FIG. 1 is a schematic cross-sectional view illustrating an electronic key according to an embodiment.

As shown in FIG. 1, an electronic key 10 includes a circuit board 11 and a casing 12. The circuit board 11 has a top face 11a and a back face 11b, and electronic parts 21 are arranged on the top face 11a and the back face 11b. The circuit board 11 is sealed by the casing 12 made of resin, except for an area of a connecting terminal to be connected to outside. The connecting terminal may correspond to a part of terminals 23, 24 to be described below.

Figure 2:
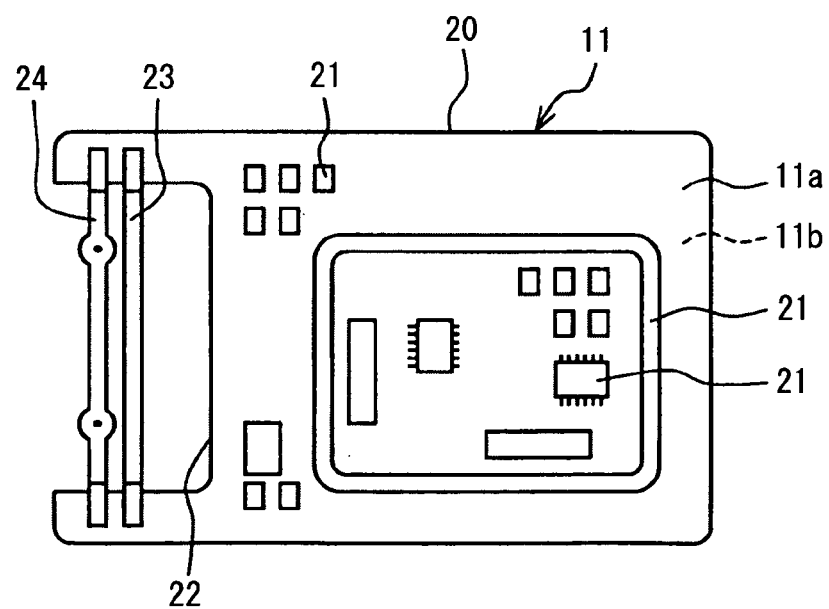
FIG. 2 is a schematic plan view illustrating a circuit board of the electronic key.

As shown in FIG. 2, the circuit board 11 has a wiring board 20, and the electronic parts 21 and the terminals 23, 24 are mounted on the wiring board 20. The wiring board 20 is made of an insulating material such as glass epoxy resin, and has a wiring pattern made of copper foil, for example. Further, the insulating material may be glass-fiber-reinforced epoxy resin. Alternatively, the insulating material may be synthetic resin or ceramic. Further, the wiring pattern has at least one layer, and the number of the layers is not limited.

The wiring board 20 has land (not shown) on the top face 11a and the back face 11b as a part of the wiring pattern, and the electronic parts 21 are soldered on the land. The electronic parts 21 are mounted on both of the top face 11a and the back face 11b of the circuit board 11. The electronic parts 21 may be resistor, capacitor, diode, transistor, IC and antenna.

The wiring board 20 has a cutout 22, and a space accommodating a battery is defined by the cutout 22. The anode and cathode terminals 23, 24 are mounted on the wiring board 20. The anode terminal 23 is configured to contact with an anode pole of the battery, and the cathode terminal 24 is configured to contact with a cathode pole of the battery.

Specifically, as shown on a left side of FIG. 2, the wiring board 20 has a U-shape open leftward. A part of an end portion of the rectangular wiring board 20 in a longitudinal direction is removed in an approximately center area in a direction perpendicular to the longitudinal direction. The removed part corresponds to the battery-accommodating space, and passes through the top face 11a and the back face 11b in a thickness direction of the circuit board 11. An edge of the removed part defines the cutout 22, and has the U-shape.

The terminals 23, 24 oppose to the battery-accommodating space, and are arranged to be a bridge connecting end portions of the U-shape. Ends of the terminal 23, 24 are soldered on the land.

The casing 12 seals all of the circuit board 11, except for a part of the terminals 23, 24. That is, all of the wiring board 20 having the electronic parts 21, and the other part of the terminals 23, 24 are sealed by the casing 12. Thus, the casing 12 defines an outer surface of the electronic key 10. The casing 12 is formed by filling thermosetting resin in a cavity of a mold, and by hardening the filled resin.

The casing 12 is formed by using a transfer molding, for example, and the transfer molding is known as being used for sealing a semiconductor package. A viscosity of melted thermosetting resin is typically lower than that of melted thermoplastic resin. Therefore, a pressure for filling the thermosetting resin in the transfer molding can be made lower, compared with a pressure for filling the thermoplastic resin in an injection molding.

Further, a temperature for hardening the thermosetting resin is low, compared with a temperature for melting the thermoplastic resin in the injection molding. Therefore, the transfer molding is suitable for sealing the circuit board 11 to which the electronic parts 21 are soldered.

As shown in FIG. 1, the casing 12 is constructed by a first casing 30 and a second casing 31 tightly contacting with each other. Both of the first casing 30 and the second casing 31 are produced by the transfer molding, for example. The first casing 30 seals all the top face 11a of the circuit board 11 and the electronic parts 21 mounted on the top face 11a. Further, all side face of the circuit board 11 is sealed by the first casing 30. The second casing 31 seals all the back face 11b of the circuit board 11 and the electronic parts 21 mounted on the back face 11b. A border face between the first casing 30 and the second casing 31 contacting with each other is located on the same plane as the back face 11b of the circuit board 11.

As shown in FIG. 1, an outer shape of the casing 12 is made into an approximately card shape. For example, outer dimensions of the casing 12 are approximately equal to outer dimensions of ID-1 type card such as a normal credit card.

The casing 12 is made of thermosetting resin having a hardening temperature T2. The hardening temperature T2 is lower than a melting temperature T1 of a solder used for mounting the electronic parts 21 (T1>T2). A difference between the resin hardening temperature T2 and the solder melting temperature T1 may be made larger.

For example, the casings 30, 31 are made of epoxy resin having the hardening temperature T2 of 170° C., which is sufficiently lower than the solder melting temperature T1 of 240° C. Therefore, the solder can be restricted from melting while the casing 12 is formed.

The epoxy resin has a high heat-resisting property and a high mechanical strength. Therefore, a reliability of the electronic key 10 can be raised by using the epoxy resin for the casing 12 of the electronic key 10, in a case when the electronic key 10 is always carried by a person.

Alternatively, the casing 12 may be made of other thermosetting resin such as phenol resin or unsaturated polyester resin. In this case, the relationship of T1>T2 is necessary.

Figure 3:
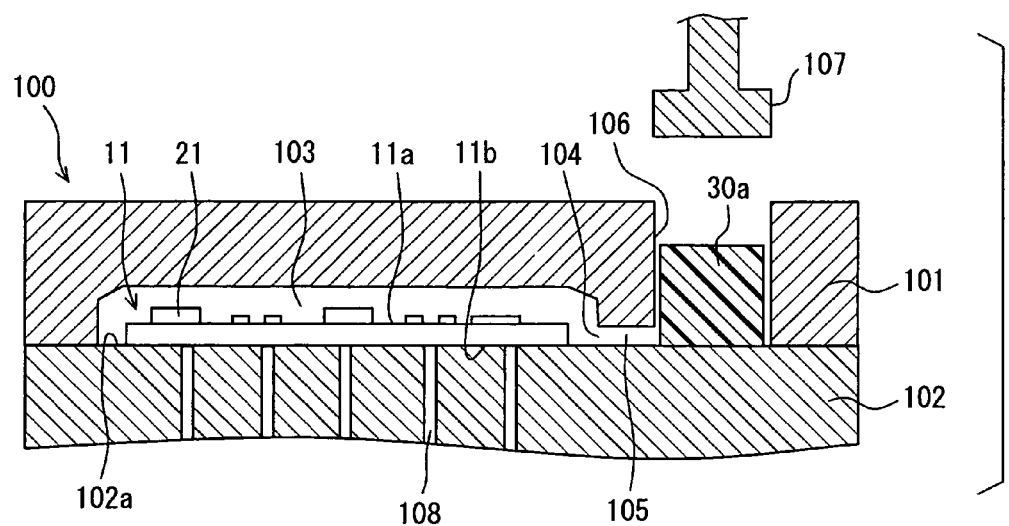
FIG. 3 is a cross-sectional view illustrating a first holding process of a method of producing the electronic key.

A method of producing the electronic key 10 will be described. As shown in FIG. 3, the circuit board 11 is prepared. At this time, the electronic parts 21 are mounted only on the top face 11a in advance. In this embodiment, the terminal 23, 24 is also mounted on the top face 11a. The circuit board 11 is arranged in a cavity 103 of a mold 100 in a manner that the back face 11b of the circuit board 11 is tightly contact with an upper face 102a of a lower mold 102. The upper face 102a is to be an inner face of the cavity 103 of the mold 100 while a molding of the first casing 30 is performed. Similarly, an upper mold 101 also defines another inner face of the cavity 103.

The mold 100 has the upper mold 101, the lower mold 102 and a slide core (not shown). The upper mold 101 is arranged on an upper side in a thickness direction of the circuit board 11, and the lower mold 102 is arranged on a lower side in the thickness direction of the circuit board 11. The slide core is used for forming the battery-accommodating space by covering a center part of the terminal 23, 24. The mold 101, 102 has a fixed board (not shown) or a movable board (not shown), and is fixed on a platen of a molding machine (not shown).

As shown in FIG. 3, the upper mold 101 has a sprue 105 corresponding to a passage for supplying resin into the cavity 103 through a gate 104. The sprue 105 may correspond to a runner. A pot 106 is arranged on an upstream side of the sprue 105, and extends in the thickness direction. Resin is input through the pot 106. A piston plunger 107 is arranged above the pot 106, and is movable into the pot 106 through a hole of the platen (not shown).

The lower mold 102 has a suction hole 108 through which the circuit board 11 set in the cavity 103 is sucked and held by a negative pressure. The suction hole 108 is connected to a vacuum pump (not shown) through a pipe (not shown). A pressure of the suction hole 108 is controlled to be negative, if necessary.

The upper mold 101 and the lower mold 102 are separated from each other before a molding of the first casing 30 is performed. In this state, the circuit board 11 is arranged at a predetermined position in a manner that all the back face 11b contacts the upper face 102a of the lower mold 102. At this time, the electronic parts 21 are mounted on only the top face 11a of the circuit board 11. The upper face 102a is to be an inner face of the cavity 103 during the molding.

At this time, the suction hole 108 is made to have a negative pressure, thereby a force is applied to the circuit board 11 downward. Thus, the circuit board 11 completely contacts with the upper face 102a of the lower mold 102. The upper mold 101 and the lower mold 102 are tightened with each other in this state.

As shown in FIG. 3, a tablet 30a made of resin material used for the transfer molding is input in the pot 106 through an upper opening, when the mold 100 is tightened such that the circuit board 11 is held in the cavity 103.

The resin material is made of thermosetting resin such as epoxy resin, in this embodiment. Specifically, filler such as silica and a hardening agent are added into the epoxy resin. Further, catalyst such as hardening promoting agent, and mold-releasing agent are suitably added into the epoxy resin. The tablet 30a is produced by solidifying epoxy resin having B-stage particles in advance. Due to the tablet 30a, operation can be easily performed, and air can be prevented from mixing into the first casing 30. The tablet 30a is input into the pot 106 after heated, if necessary.

At this time, a temperature of the mold 100 is made to be suitable for hardening the thermosetting resin. The circuit board 11 is arranged in the cavity 103 during the molding of the casing 30, and the electronic parts 21 and the terminals 23, 24 are soldered on the circuit board 11. The solder is required to be restricted from melting during the molding of the casing 30. Therefore, the temperature of the mold 100 is set sufficiently high for hardening the thermosetting resin, and is set sufficiently low for restricting the melting of the solder. In this embodiment, the solder has a melting temperature of 240° C., and the epoxy resin has a hardening temperature of 170° C.

Figure 4:
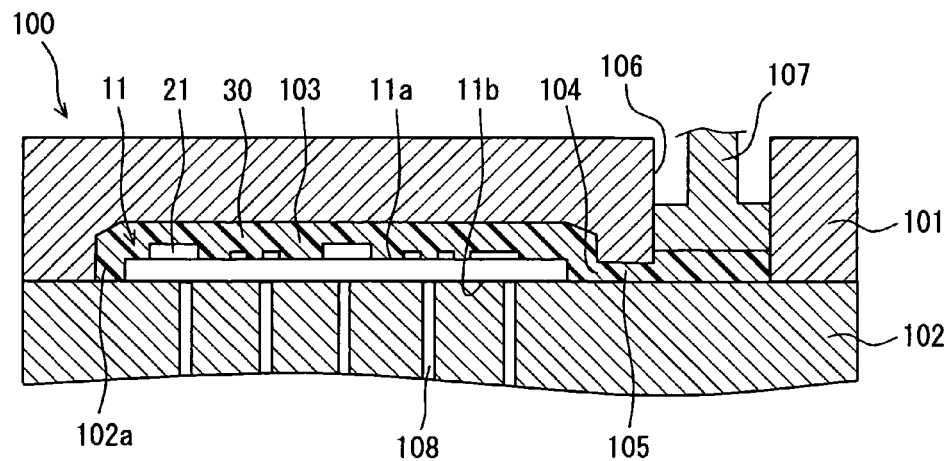
FIG. 4 is a cross-sectional view illustrating a first molding process of the method of producing the electronic key.

As shown in FIG. 4, the plunger 107 is lowered into the pot 106, and the tablet 30a is softened to have a liquid state. The liquid resin is filled in the cavity 103 through the sprue 105 and the gate 104. The liquid resin filled in the cavity 103 receives heat from the mold 100, so as to have polymerization. Thus, the liquid resin is solidified, such that the first casing 30 can be formed.

After the molding of the casing 30 is finished, the upper mold 101 and the lower mold 102 are separated from each other. When an ejector device (not shown) is activated, the casing 30 is separated from the mold 100. The casing 30 is molded in a state that the circuit board 11 is arranged in the casing 30. At this time, the casing 30 has unnecessary resin solidified in the sprue 105 corresponding to the runner, and a cull of resin solidified in the pot 106. The cull and the runner are removed by cutting at a position corresponding to the gate 104.

All the electronic parts 21 mounted on the top face 11a, the top face 11a and the side faces of the circuit board 11, and a part of the terminal 23, 24 are sealed by the resin material. That is, the circuit board 11 and its adjacent part are sealed by the resin material. The back face 11b of the circuit board 11 is exposed from the first casing 30. Specifically, a surface of the first casing 30 defines an outer surface of the electronic key 10, and the back face 11b of the circuit board 11 is smoothly connected to the surface of the first casing 30, so as to form the same plane.

Figure 5:
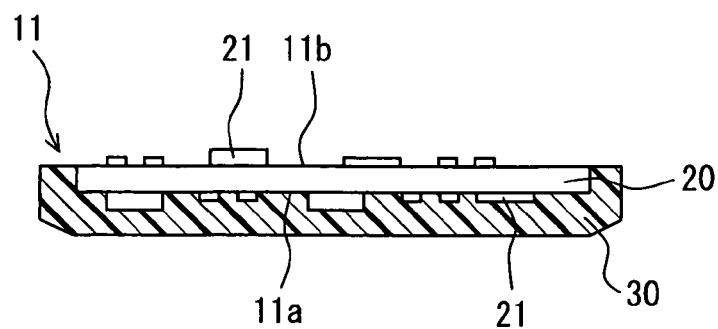
FIG. 5 is a cross-sectional view illustrating a second mounting process of the method of producing the electronic key.

As shown in FIG. 5, a reflow soldering of electronic parts 21 is performed on the back face 11b of the circuit board 11 exposed from the first casing 30, after the molding of the first casing 30 is finished. Thus, the electronic parts 21 are mounted on both of the top face 11a and the back face 11b.

Figure 6:
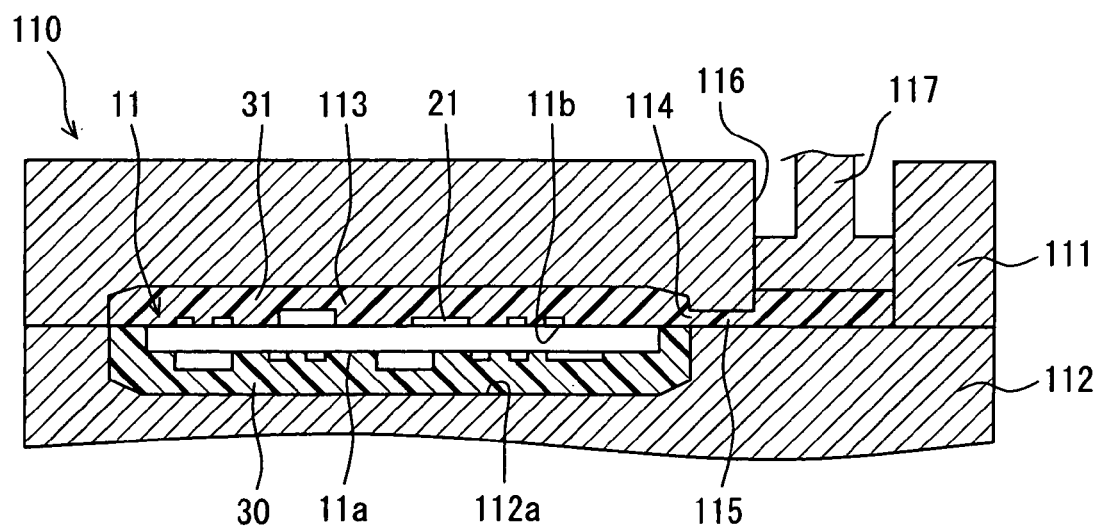
FIG. 6 is a cross-sectional view illustrating a second molding process of the method of producing the electronic key.

As shown in FIG. 6, the circuit board 11 is arranged in a cavity 113 of a mold 110, after the electronic parts 21 are mounted on the back face 11b. At this time, a part of the outer surface of the first casing 30 is tightly contact with a part of an inner face of the cavity 113.

The mold 110 has a construction approximately similar to the mold 100. The mold 110 has an upper mold 111, a lower mold 112 and a slide core (not shown). The slide core is used for forming the battery-accommodating space by covering a center part of the terminal 23, 24. The mold 111, 112 has a fixed board (not shown) or a movable board (not shown), and is fixed on a platen of a molding machine (not shown).

The upper mold 111 has a sprue 115 corresponding to a passage for supplying resin into the cavity 113 through a gate 114. The sprue 115 may correspond to a runner. A pot 116 is arranged on an upstream side of the sprue 115, and extends in the thickness direction. Resin is input through the pot 116. A piston plunger 117 is arranged above the pot 116, and is movable into the pot 116 through a hole of the platen (not shown).

The upper mold 111 and the lower mold 112 are separated from each other before a molding of the second casing 31 is performed. In this state, the circuit board 11 is arranged at a predetermined position in a manner that the outer surface of the first casing 30 is contact with a concave face 112a of the lower mold 112. At this time, the electronic parts 21 are mounted on both of the top face 11a and the back face 11b of the circuit board 11. The concave face 112a is to be an inner face of the cavity 113 during the molding. The lower mold 112 does not have a suction hole, because the position of the first casing 30 is determined by the concave face 112a of the lower mold 112.

Similarly to the molding of the first casing 30, a tablet (not shown) made of resin material used for the transfer molding is input into the pot 116 through an upper opening, when the mold 110 is tightened such that the circuit board 11 is held in the cavity 113.

The resin material is made of thermosetting resin. In this embodiment, the resin material of the second casing 31 is made of the same material forming the first casing 30. Specifically, the resin material of the second casing 31 is made of epoxy resin containing filler such as silica, a hardening agent, catalyst such as hardening promoting agent, and mold-releasing agent. The tablet is produced by solidifying epoxy resin having B-stage particles in advance.

A temperature of the mold 110 is made to be suitable for hardening the thermosetting resin, when the second casing 31 is molded. The temperature of the mold 110 is set sufficiently high for hardening the thermosetting resin, and is set sufficiently low for restricting the melting of the solder.

As shown in FIG. 6, the plunger 117 is lowered into the pot 116, and the tablet is softened to have a liquid state. The liquid resin is filled in the cavity 113 through the sprue 115 and the gate 114. The liquid resin filled in the cavity 113 receives heat from the mold 110, so as to have polymerization. Thus, liquid resin is solidified, such that the second casing 31 can be formed.

After the molding of the second casing 31 is finished, the upper mold 111 and the lower mold 112 are made separated from each other. When an ejector device (not shown) is activated, the second casing 31 is separated from the mold 110. The second casing 31 is molded in a state that the circuit board 11 is arranged in the second casing 31. At this time, the second casing 31 has unnecessary resin solidified in the sprue 115 corresponding to the runner, and a cull of resin solidified in the pot 116. The cull and the runner are removed by cutting at a position corresponding to the gate 114. Thus, the electronic key 10 can be produced.

All the electronic parts 21 mounted on the back face 11b, and the back face 11b of the circuit board 11 are sealed by the resin material of the second casing 31 molded in the cavity 113. Further, the second casing 31 is tightly contact with the first casing 30 having the same plane as the back face 11b of the circuit board 11. Therefore, the first casing 30 and the second casing 31 are integrated with each other, so as to define the single casing 12 of the electronic key 10.

The circuit board 11, the electronic parts 21 mounted on the circuit board 11, and the terminals 23, 24 to be connected to outside are completely buried and sealed in the resin forming the casing 12. Therefore, electronic circuit located in the casing 12 is completely closed, except for the terminals 23, 24 opposing to the battery-accommodating space, such that the electronic key 10 can have a waterproof structure.

The polymerization of the epoxy resin may be completed after the molding of the casing 12 is finished, if necessary. The casing 12 is heated for a predetermined period at a temperature sufficiently lower than the melting temperature of the solder. Thus, the thermosetting resin can be further hardened.

Advantages of the method of producing the electronic key 10 will be described. The casing 12 is formed by a molding of the first casing 30 and a molding of the second casing 31. The first casing 30 covers the top face 11a of the circuit board 11, and the second casing 31 covers the back face 11b of the circuit board 11.

When the first casing 30 is molded, the electronic parts 21 are mounted only on the top face 11a, and the back face 11b does not have an electronic part. Therefore, the back face 11b can be made to be tightly contact with the upper face 102a of the mold 100. Resin material containing the epoxy resin is filled and solidified in the cavity 103 in a state that the back face 11b is tightly contact with the upper face 102a of the mold 100.

At this time, the resin material presses only the top face 11a, thereby the circuit board 11 is pressed onto the lower mold 102 of the mold 100. However, the circuit board 11 is supported by the mold 100 in a state that all the back face 11b is tightly contact with the upper face 102a of the mold 100. Therefore, the circuit board 11 can be restricted from having a deformation, and connection reliability of the electronic parts 21 can be restricted from being lowered.

When the second casing 31 is molded, resin material containing the epoxy resin is filled and solidified in the cavity 113 in a state that the part of the outer surface of the first casing 30 is tightly contact with the concave face 112a of the lower mold 112 of the mold 110. Therefore, the resin material presses only the back face 11b, thereby the circuit board 11 is pressed onto the lower mold 112 of the mold 110. However, the circuit board 11 can be restricted from having a deformation, and connection reliability of the electronic parts 21 can be restricted from being lowered, because the circuit board 11 is supported by the mold 110 through the first casing 30.

After the first casing 30 is molded, the electronic parts 21 are further mounted on the back face 11b exposed from the first casing 30, and the second casing 31 is molded. Thus, the electronic parts 21 can be mounted on both of the top face 11a and the back face 11b. Therefore, a size of the circuit board 11 of the electronic key 10 can be made smaller in a direction parallel to the circuit board 11.

According to the embodiment, the circuit board 11 can be restricted from having a deformation, and connection reliability of the electronic parts 21 can be restricted from being lowered, even when the casing 12 is molded in a state that the circuit board 11 is arranged in the casing 12. At this time, the circuit board 11 has the electronic parts 21 on both of the top face 11a and the second face 11b. Further, the size of the electronic key 10 can be made smaller in a direction perpendicular to the thickness direction of the electronic key 10.

All of the circuit board 11 is completely buried in the casing 12, except for an area of the terminal 23, 24. Therefore, reliability for sealing the circuit board 11 can be increased, compared with a case in which a border face between a circuit board and a casing is exposed outside.

A supporting pin is unnecessary in a process for producing the casing 12, while all outline of the circuit board 11 is completely buried in the casing 12. Therefore, an appearance of the electronic key 10 can be made better.

The casing 30, 31 is formed by using the transfer molding. In this case, a void may be generated at a position adjacent to the gate 104, 114, or the electronic parts may have damage at a position distanced from the gate 104, 114. The void and the damage of the electronic parts are easily generated when a size of the circuit board 11 is larger in a direction parallel to the circuit board 11.

However, according to the embodiment, because the electronic parts 21 are mounted on both of the top face 11a and the back face 11b of the circuit board 11, the size of the circuit board 11 can be made smaller, compared with a case in which electronic parts are mounted on only a single face of a circuit board. Therefore, the void and the damage of the electronic parts can be reduced when the transfer molding is performed.

The first casing 30 and the second casing 31 are made of the same material containing epoxy resin, and are tightly contact with each other. The casings 30, 31 are restricted from separating from each other, because a stress is generated between the casings 30, 31 by a difference of linear expansion coefficients of the casings 30, 31. That is, reliability of the casing 12 for sealing the circuit board 11 can be increased.

As shown in FIG. 1, an outer shape of the casing 12 has an approximately card shape. That is, the casing 12 is flat, and the thickness of the circuit board 11 is small. Therefore, in a comparison example, if a casing is formed by a single molding process in a state that a circuit board is supported in a float state, the circuit board may have a large deformation.

In the comparison example, a resin presses the circuit board, because a hardening speed of the resin is different between a top face and a back face. However, according to the embodiment, the circuit board 11 can be restricted from having a deformation, because the circuit board 11 is formed by the two molding processes. Further, the circuit board 11 is not supported in the float state, but is supported by the mold 100, 110.

Changes and modifications are to be understood as being within the scope of the present invention as defined by the appended claims.

The casing 30, 31 is not limited to be formed by using the transfer molding. Alternatively, at least one of the casings 30, 31 may be formed by using a compression molding.

The electronic device is not limited to the electronic key 10 corresponding to the mobile two-way transmitter used for the smart entry system. Alternatively, the electronic device may be other transmitter used for a keyless entry system, or may be other electronic device mounted on a vehicle. Further, the electronic device is not limited to be used for the vehicle.

The casing 12 of the electronic key 10 is not limited to have the approximately card shape. When the casing 12 has a thin flat shape, the casing 12 is required to have a predetermined mechanical strength. In this embodiment, the casing 12 is made of thermosetting resin, such that the casing 12 can have the predetermined mechanical strength.

The first casing 30 is molded by using the mold 100, and the second casing 31 is molded by using the mold 110. The mold 100 and the mold 110 are different from each other. However, a shape of the upper mold 101 of the mold 100 opposing to the top face 11a of the circuit board 11 corresponds to a shape of the lower mold 112 of the mold 110 opposing to the top face 11a of the circuit board 11. Therefore, a part of the mold 100 may be used as a part of the mold 110.

The border of the casings 30, 31 contacting with each other is smoothly connected to the back face 11b of the circuit board 11, so as to form the same plane. However, a position of the border of the casings 30, 31 is not limited to be connected to the back face 11b of the circuit board 11.

The first casing 30 and the second casing 31 are made of the same material containing epoxy resin. However, a linear expansion coefficient of the second casing 31 may be made smaller than that of the first casing 30. For example, the linear expansion coefficient of the first casing 30 is made approximately equal to that of the circuit board 11, and the linear expansion coefficient of the second casing 31 may be made smaller than that of the first casing 30.

The second casing 31 has only the second molding process, because the second casing 31 does not have the first molding process. Therefore, a polymerization degree of the second casing 31 is delayed compared with a polymerization degree of the first casing 30. When the second molding process is finished, the polymerization degree of the first casing 30 is high, because the first casing 30 has much polymerization than the second casing 31. Thus, the first casing 30 is more stable than the second casing 31, when the second molding process is finished.

Therefore, when the linear expansion coefficient of the second casing 31 is made smaller than that of the first casing 30, a shrinkage amount of the second casing 31 can be made smaller. Thus, the casings 30, 31 are restricted from separating from each other at the border of the casings 30, 31. That is, reliability of the casing 12 for sealing the circuit board 11 can be increased.

The first casing 30 receives heat from the mold 110 in the second molding process. A stress or a distortion of the first casing 30 can be reduced by the heat received in the second molding process, because the heat has an effect of annealing. Therefore, the electronic parts 21 such as an oscillator or an antenna may be mounted on the top face 11a of the circuit board 11 before the first molding process, because its frequency characteristics are affected by the stress or the distortion.

What is claimed is:

1. A method of producing an electronic device comprising:
mounting electronic parts on only a first face of a circuit board;
holding the circuit board in a first cavity of a first mold in a manner that a second face of the circuit board opposite from the first face is tightly contact with an inner face of the first cavity of the first mold;
molding a first casing with thermosetting resin in a manner that the second face of the circuit board defines a part of an outer surface of the first casing, the first casing sealing the first face of the circuit board and the electronic parts mounted on the first face;
mounting electronic parts on the second face of the circuit board, after the molding of the first casing is finished;
holding the circuit board in a second cavity of a second mold in a manner that a part of the outer surface of the first casing is tightly contact with an inner face of the second cavity of the second mold; and
molding a second casing with thermosetting resin, the second casing sealing the second face of the circuit board and the electronic parts mounted on the second face, wherein
the molding of the second casing integrates the first casing and the second casing with each other so as to form a casing of the electronic device, and
the first casing and the second casing are tightly contact with each other.

2. The producing method according to claim 1, wherein the molding of the first casing and the molding of the second casing are performed by using a transfer molding.

3. The producing method according to claim 1, wherein the first casing and the second casing are made of the same material.

4. The producing method according to claim 1, wherein the second casing has a linear expansion coefficient smaller than that of the first casing.

5. The producing method according to claim 1, wherein the electronic device has an approximately card shape.

6. The producing method according to claim 1, wherein the inner face of the first cavity of the first mold is flat, and the inner face of the second cavity of the second mold has a concave shape corresponding to a shape of the part of the outer surface of the first casing.

7. The producing method according to claim 1, wherein the first casing and the second casing are tightly contact with each other on a border face defined between the first casing and the second casing, and
the border face is smoothly connected to the second face of the circuit board, so as to form the same plane.

8. A method of producing an electronic device comprising:
mounting electronic parts on only a first face of a circuit board;
holding the circuit board in a first cavity of a first mold, a second face of the circuit board opposite from the first face directly contacting an inner face of the first cavity of the first mold;
molding a first casing over the first face of the circuit board with first thermosetting resin the entire second face of the circuit board not being covered by the first thermosetting resin, the first casing sealing the first face of the circuit board and the electronic parts mounted on the first face;
mounting electronic parts on only the second face of the circuit board, after the molding of the first casing is finished;
holding the circuit board in a second cavity of a second mold a part of an outer surface of the first casing directly contacting an inner face of the second cavity of the second mold; and
molding a second casing over the second face of the circuit board with second thermosetting resin, the second casing sealing the second face of the circuit board and the electronic parts mounted on the second face, wherein
the molding of the second casing integrates the first casing and the second casing with each other so as to form a second casing of the electronic device, the circuit board and the electronic parts mounted on the first and second faces of the circuit board being disposed within the molded first and second casings, and
the first casing and the second casing tightly contact each other.

* * * * *